(12) United States Patent
Gustaferro et al.

(10) Patent No.: US 10,206,303 B2
(45) Date of Patent: Feb. 12, 2019

(54) UNIVERSAL AISLE CONTAINMENT COLUMN ADAPTER

(71) Applicant: Panduit Corp., Tinley Park, IL (US)

(72) Inventors: David W. Gustaferro, Naperville, IL (US); William A. Bernard, Darien, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/832,902

(22) Filed: Dec. 6, 2017

(65) Prior Publication Data
US 2018/0168064 A1 Jun. 14, 2018

Related U.S. Application Data

(60) Provisional application No. 62/432,222, filed on Dec. 9, 2016.

(51) Int. Cl.
*H05K 7/14* (2006.01)
*H05K 7/20* (2006.01)

(52) U.S. Cl.
CPC ....... *H05K 7/1488* (2013.01); *H05K 7/20745* (2013.01)

(58) Field of Classification Search
CPC .................................................. H05K 7/1488
See application file for complete search history.

(56) References Cited

U.S. PATENT DOCUMENTS

| 2,766,861 | A | 10/1956 | Abramson |
| 5,969,292 | A | 10/1999 | Snider, Jr. et al. |
| 7,033,267 | B2 | 4/2006 | Rasmussen |
| 7,046,514 | B2 * | 5/2006 | Fink .................. H05K 7/20 165/121 |
| 7,293,666 | B2 | 11/2007 | Mattlin et al. |
| 7,477,514 | B2 | 1/2009 | Campbell et al. |
| 7,656,660 | B2 | 2/2010 | Hoeft et al. |
| 7,878,889 | B2 | 2/2011 | Day |

(Continued)

FOREIGN PATENT DOCUMENTS

| DE | 102008024973 B3 | 9/2009 |
| JP | 2011257075 A | 12/2011 |
| WO | 2015138866 A1 | 9/2015 |

OTHER PUBLICATIONS

APC NetShelter® SX Air Recirculation Prevention Kit-AR7708; 7 pgs.; Nov. 2005.

(Continued)

*Primary Examiner* — Jeanette E Chapman
(74) *Attorney, Agent, or Firm* — Christopher S. Clancy; James H. Williams; Aimee E. McVady

(57) ABSTRACT

An aisle containment system installed around a pre-existing building column in a data center. The aisle containment system includes a frame defined by wall beams, header frames, and a plurality of posts. A plurality of cabinets are positioned within the frame. Mid-span posts are positioned adjacent building columns located within the frame. The mid-span posts support the wall beams on one side of the frame. A containment column adapter is secured to one of the wall beams and one of the mid-span posts. The containment column adapter seals the gaps between the building column and the wall beam within the frame of the aisle containment system.

13 Claims, 15 Drawing Sheets

(56) References Cited

U.S. PATENT DOCUMENTS

| | | | |
|---|---|---|---|
| 8,072,780 B1* | 12/2011 | Roy | H05K 7/20745 361/825 |
| 8,180,495 B1* | 5/2012 | Roy | H05K 7/20836 165/67 |
| 8,627,611 B2 | 1/2014 | Cottuli et al. | |
| 8,713,869 B1 | 5/2014 | Eychaner et al. | |
| 8,787,023 B2 | 7/2014 | Lewis, II et al. | |
| 8,857,120 B2 | 10/2014 | Marrs et al. | |
| 9,066,450 B2 | 6/2015 | Bednarcik et al. | |
| 9,255,417 B2 | 2/2016 | Bernard | |
| 9,313,927 B2 | 4/2016 | Krietzman | |
| 2008/0180908 A1* | 7/2008 | Wexler | H05K 7/20745 361/690 |
| 2008/0266789 A1 | 10/2008 | Hruby et al. | |
| 2009/0173017 A1 | 7/2009 | Hall | |
| 2009/0277605 A1* | 11/2009 | VanGilder | G06F 1/20 165/67 |
| 2010/0024353 A1* | 2/2010 | Pope | E04B 1/3431 52/745.02 |
| 2010/0144265 A1* | 6/2010 | Bednarcik | H05K 7/20745 454/184 |
| 2010/0248609 A1* | 9/2010 | Tresh | H05K 7/20745 454/184 |
| 2011/0108207 A1* | 5/2011 | Mainers | H05K 7/20745 160/87 |
| 2011/0271610 A1* | 11/2011 | Cottuli | H05K 7/20745 52/173.1 |
| 2011/0278999 A1 | 11/2011 | Caveney et al. | |
| 2012/0181906 A1 | 7/2012 | Caveney | |
| 2013/0160271 A1 | 6/2013 | Krietzman et al. | |
| 2013/0165035 A1 | 6/2013 | Krietzman et al. | |
| 2013/0210335 A1* | 8/2013 | Krietzman | H05K 5/0213 454/184 |
| 2013/0276389 A1* | 10/2013 | Marrs | A62C 35/00 52/173.1 |
| 2014/0196394 A1 | 7/2014 | Greeson et al. | |

OTHER PUBLICATIONS

Eaton Corp. Airflow Management Solutions Product Brochure; 9 pgs.; Mar. 2016.
Wrightline Independent Containment System (ICS) Instruction Sheets, 6 pgs.; Nov. 7, 2009.

* cited by examiner the present invention relates to an aisle containment system, and more particularly to an aisle containment system installed around a building column.

UNIVERSAL AISLE CONTAINMENT COLUMN ADAPTER

CROSS REFERENCE TO RELATED APPLICATION

This application claims priority to U.S. Provisional Application No. 62/432,222, filed Dec. 9, 2016, the subject matter of which is hereby incorporated by reference in its entirety.

FIELD OF THE INVENTION

The present invention relates to an aisle containment system, and more particularly to an aisle containment system installed around a building column.

BACKGROUND OF THE INVENTION

Applicant's U.S. Pat. No. 9,255,417 is directed to an independent aisle containment system installed in a data center. The independent aisle containment system separates hot air and cold air within the data center. The independent aisle containment system is self-supporting which enables cabinets to be easily added or removed from the aisle without disturbing the structure of the aisle containment system.

A problem occurs when the independent aisle containment system is to be installed in an area with pre-existing building columns. Building columns are commonly found in data center environments, particularly larger data centers. To effectively utilize the space within a data center and increase efficiency of the cooling systems, it is desirable to install an aisle containment system around the building columns, while maintaining separation of the hot and cold air within the data center.

Thus, it would be desirable to provide a device to seal the gaps around the pre-existing building columns thereby enabling the independent aisle containment system to be installed around the building column while maintaining containment of the aisle.

SUMMARY OF THE INVENTION

An aisle containment system is disclosed. The aisle containment system includes a frame defined by wall beams, header frames, and a plurality of posts. A plurality of cabinets are positioned within the frame. Mid-span posts are positioned adjacent pre-existing building columns that are located within the frame. The mid-span posts support the wall beams on one side of the frame. At least one containment column adapter is secured to one of the wall beams and one of the mid-span posts. The at least one containment column adapter is installed to seal the gap between the building column and the wall beam within the frame of the aisle containment system.

DETAILED DESCRIPTION

Figure 1:
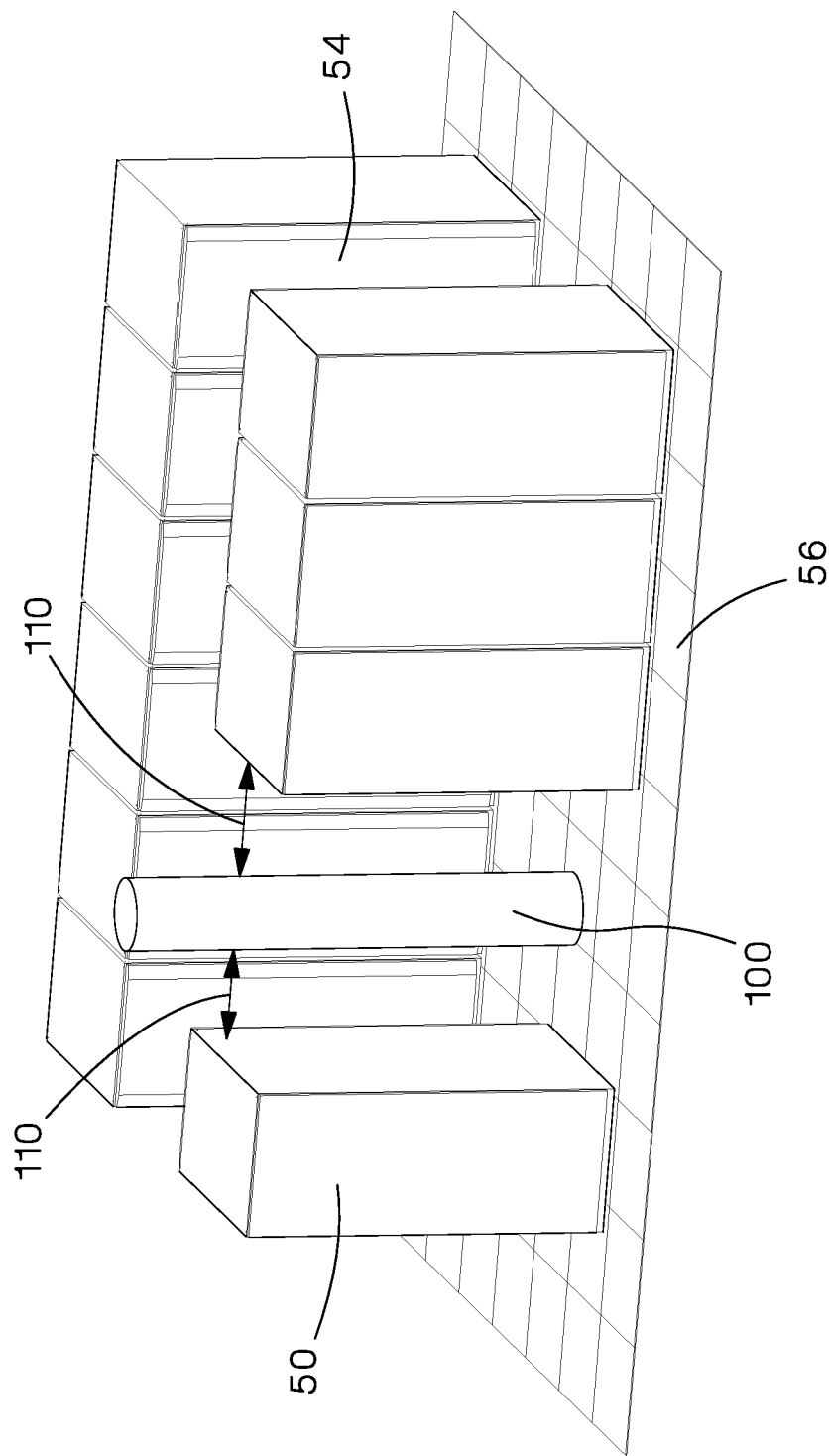
FIG. 1 is a perspective view of cabinets and a cylindrical building column in a data center.

FIG. 1 illustrates a plurality of cabinets 50 installed in a data center around a pre-existing building column 100. The cabinets 50 are arranged in two rows forming an aisle 54 therebetween. Often the pre-existing building columns 100 interfere with the formation of the aisle containment system. The building columns 100 are generally cylindrical or rectangular. As illustrated in FIG. 1, the row formed around the building column 100 includes gaps 110 or openings between the building column 100 and adjacent cabinets 50. The present invention provides a containment column adapter 150 that closes the gap 110 between the building column 100 and the cabinets 50 thereby maintaining containment of the aisle 54 formed by the cabinets 50.

Figure 2:
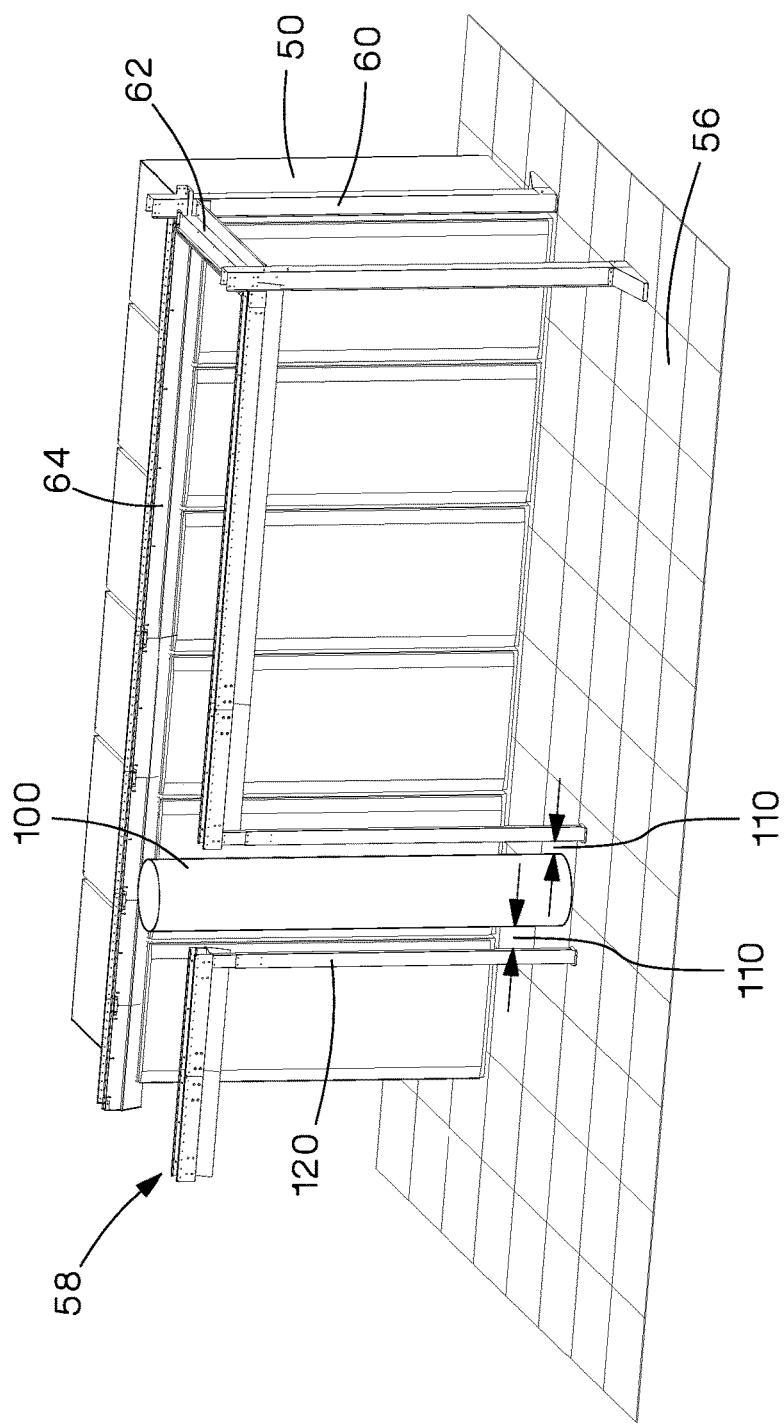
FIG. 2 is a perspective view of an aisle containment system installed around the cylindrical building column of FIG. 1.

FIG. 2 illustrates an aisle containment system installed around a cylindrical building column. The cabinets 50 have been removed from one side of the aisle to illustrate the frame 58 forming the aisle and positioned around the building column 100. The frame 58 is similar to the frame of Applicant's aisle containment system disclosed in U.S. Pat. No. 9,255,417, herein incorporated by reference. The frame 58 is positioned on the floor 56. Although only one end is illustrated, posts 60 and a header frame 62 are located at each end of the frame 58. Wall beams 64 are positioned above the cabinets 50 and are designed to extend between the posts 60.

The frame 58 includes two mid span posts 120 that are positioned on each side of the building column 100. The mid span posts 120 support the wall beams 64 on one side of the frame 58.

Figure 3:
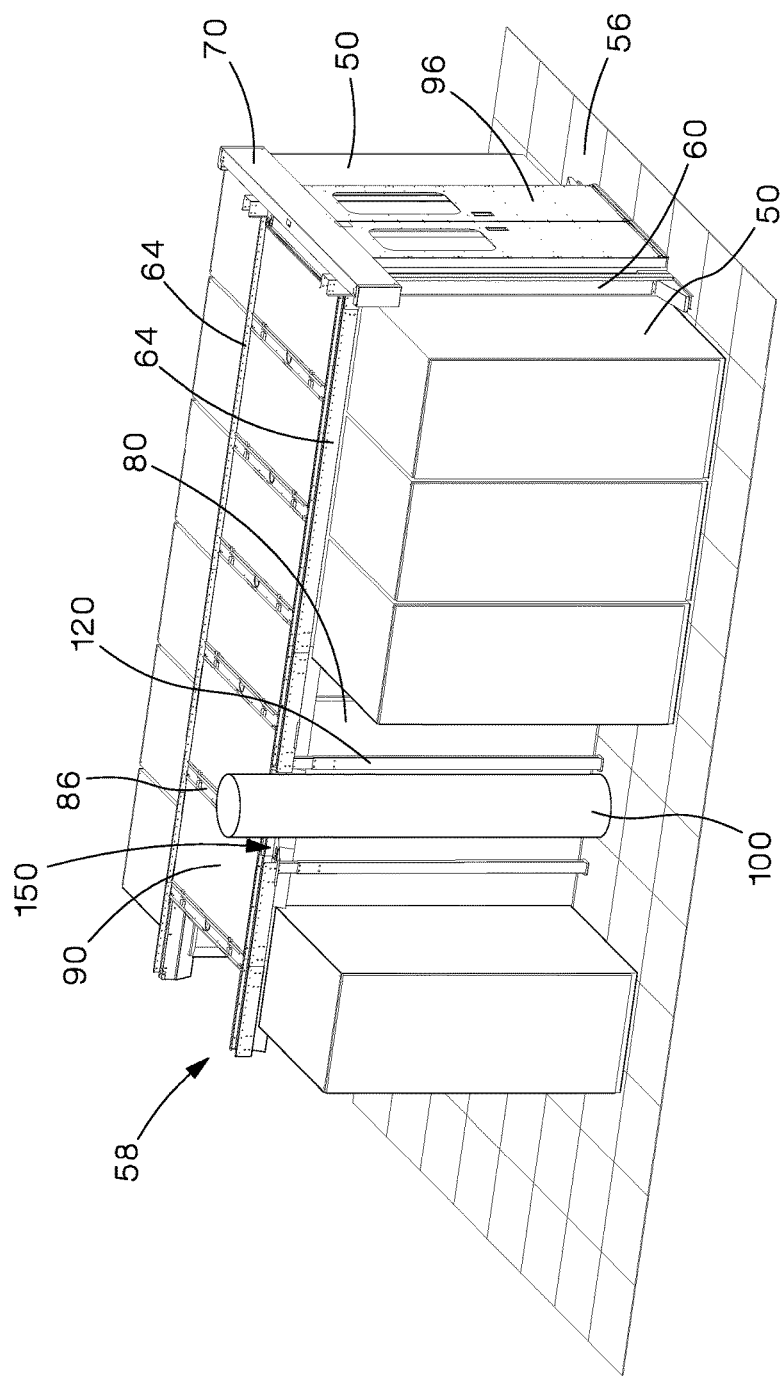
FIG. 3 is a left top perspective view of the aisle containment system of the present invention with cabinets, ceiling panels, and a sliding door installed.
Figure 4:
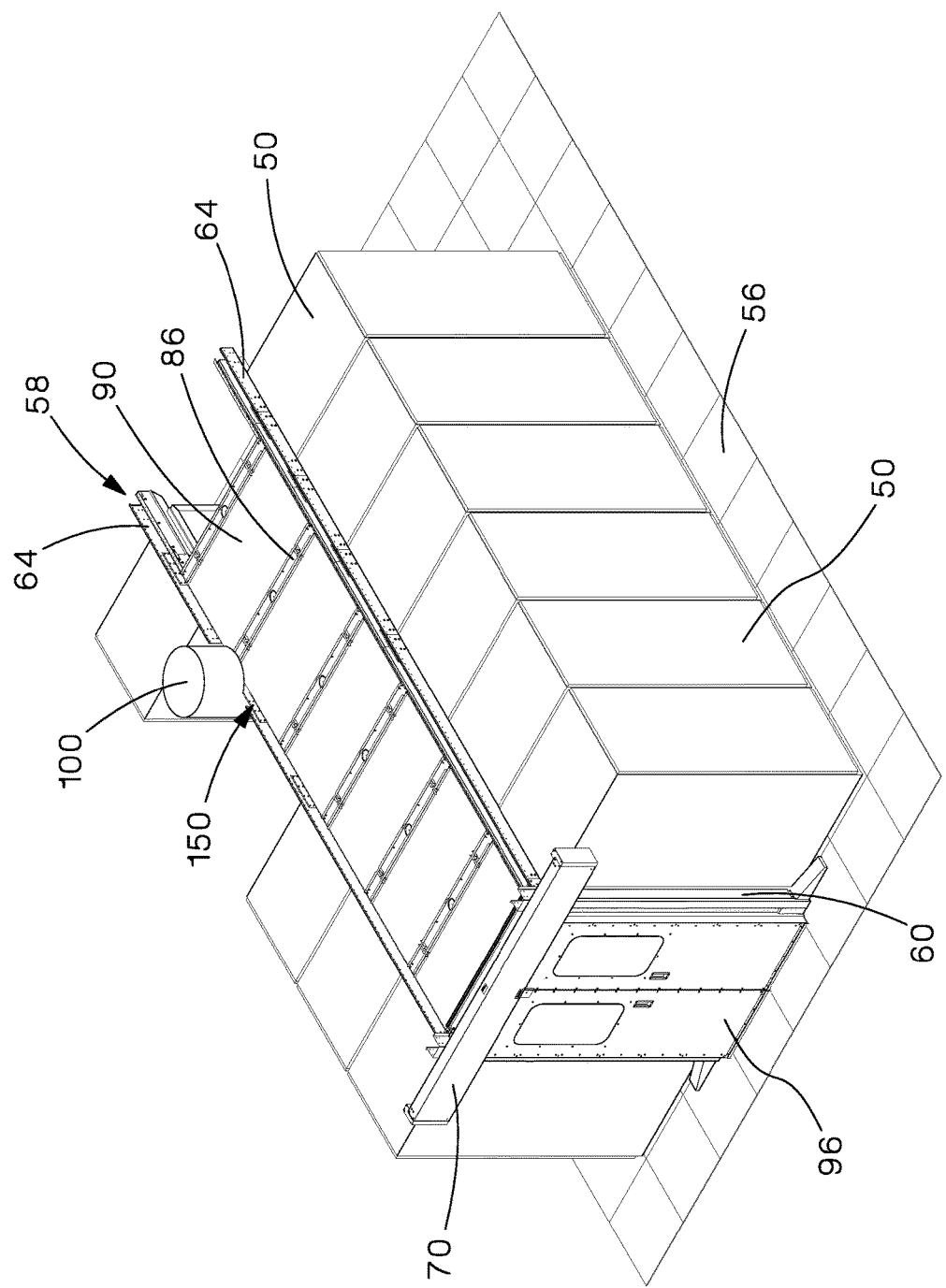
FIG. 4 is a right top perspective view of the aisle containment system of FIG. 3.

FIGS. 3 and 4 illustrate the aisle containment frame 58 of FIG. 2 with additional cabinets 50, a header panel 70, blanking panels 80, and a sliding door 96 installed to form an aisle containment system. FIGS. 3 and 4 also illustrate a plurality of aisle beams 86 and ceiling panels 90 installed over the aisle 54. The aisle beams 86 and ceiling panels 90 extend between the wall beams 64 of the frame 58. FIGS. 3 and 4 also illustrate the containment column adapter 150 installed around the building column 100 and the aisle containment system frame 58.

FIGS. 5-15 illustrate the building column 100 and the containment column adapter 150 of the present invention filling the gaps 110 between the building column 100 and the aisle containment system. The cabinets 50 have been removed in several of the figures to more clearly illustrate the aisle containment frame 58 and containment column adapter 150.

Figure 5:
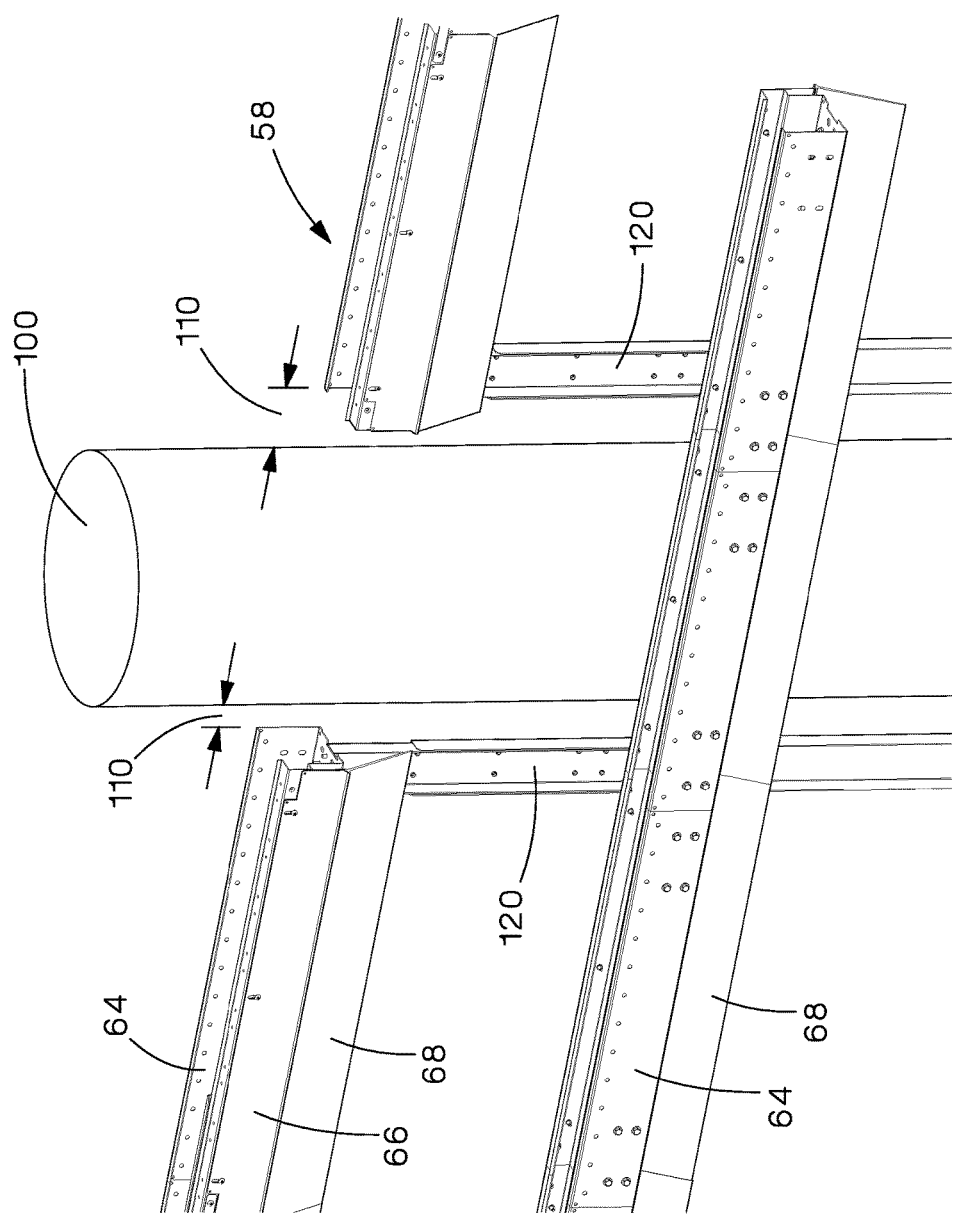
FIG. 5 is a perspective view of the wall beams of the aisle containment system and the building column of FIG. 2.

FIG. 5 illustrates a section of the aisle containment frame 58 positioned around the building column 100. As illustrated in FIG. 2, the frame 58 includes mid span posts 120 that are located at each side of the building column 100. Each mid span post 120 is designed to support the wall beam 64 and attached wall beam clamp 66 with a flap seal 68. There is a gap 110 between the building column 100 and the wall beam 64 and each mid span post 120. This gap 110 must be blocked to maintain containment of the hot or cold air in the aisle. The width of the gap 110 varies depending on the column size, shape and location within the aisle containment system.

Figure 6:
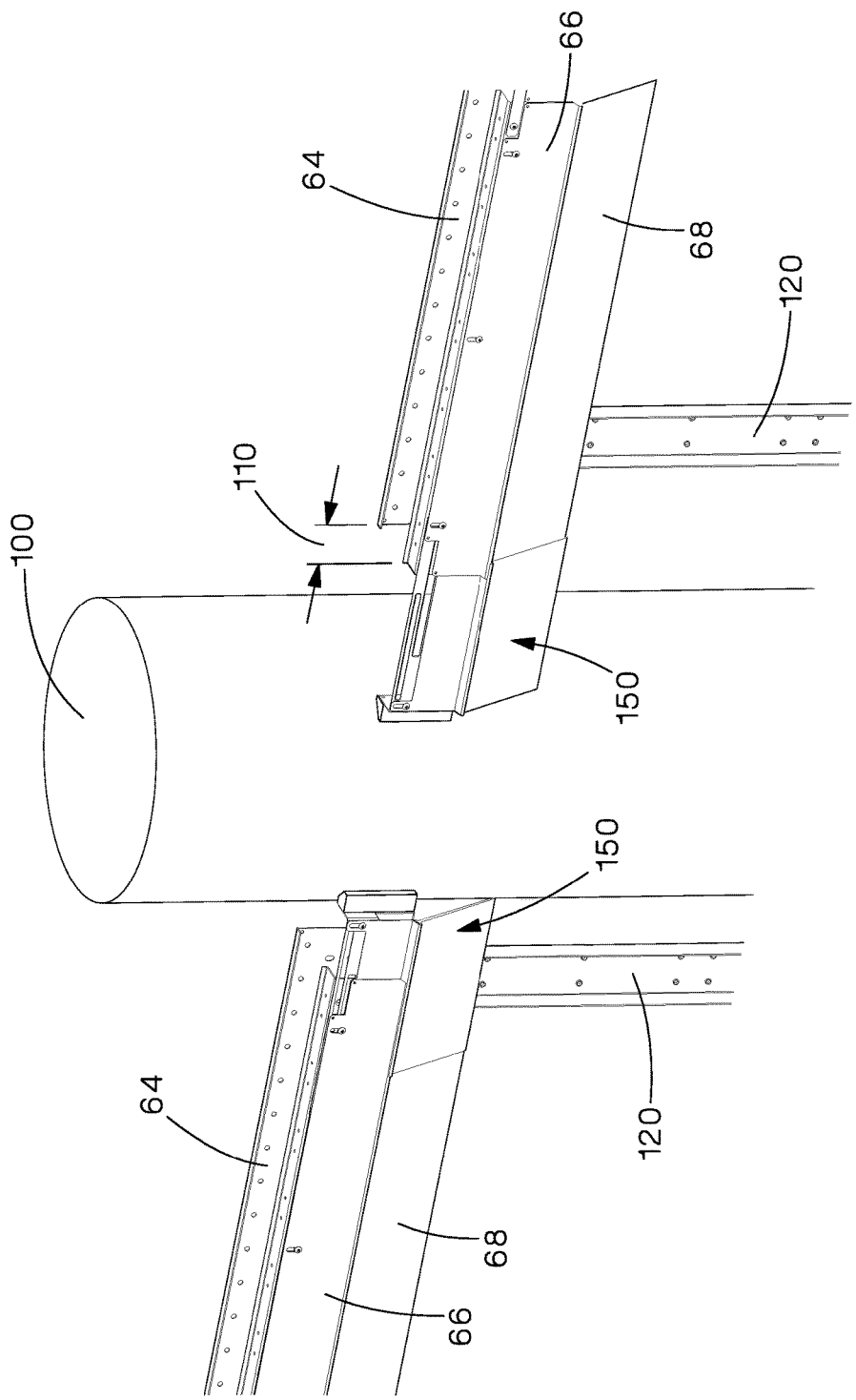
FIG. 6 is a perspective view of the wall beams and the building column of FIG. 2 with the containment column adapter of the present invention.

The containment column adapter 150 of the present invention is designed to seal the gap 110 between the cabinet 50 and the wall beam 64 and the building column 100. FIG. 6 illustrates an installed containment column adapter 150 closing and sealing the gap 110 between the building column 100 and the wall beams 64.

Figure 7:
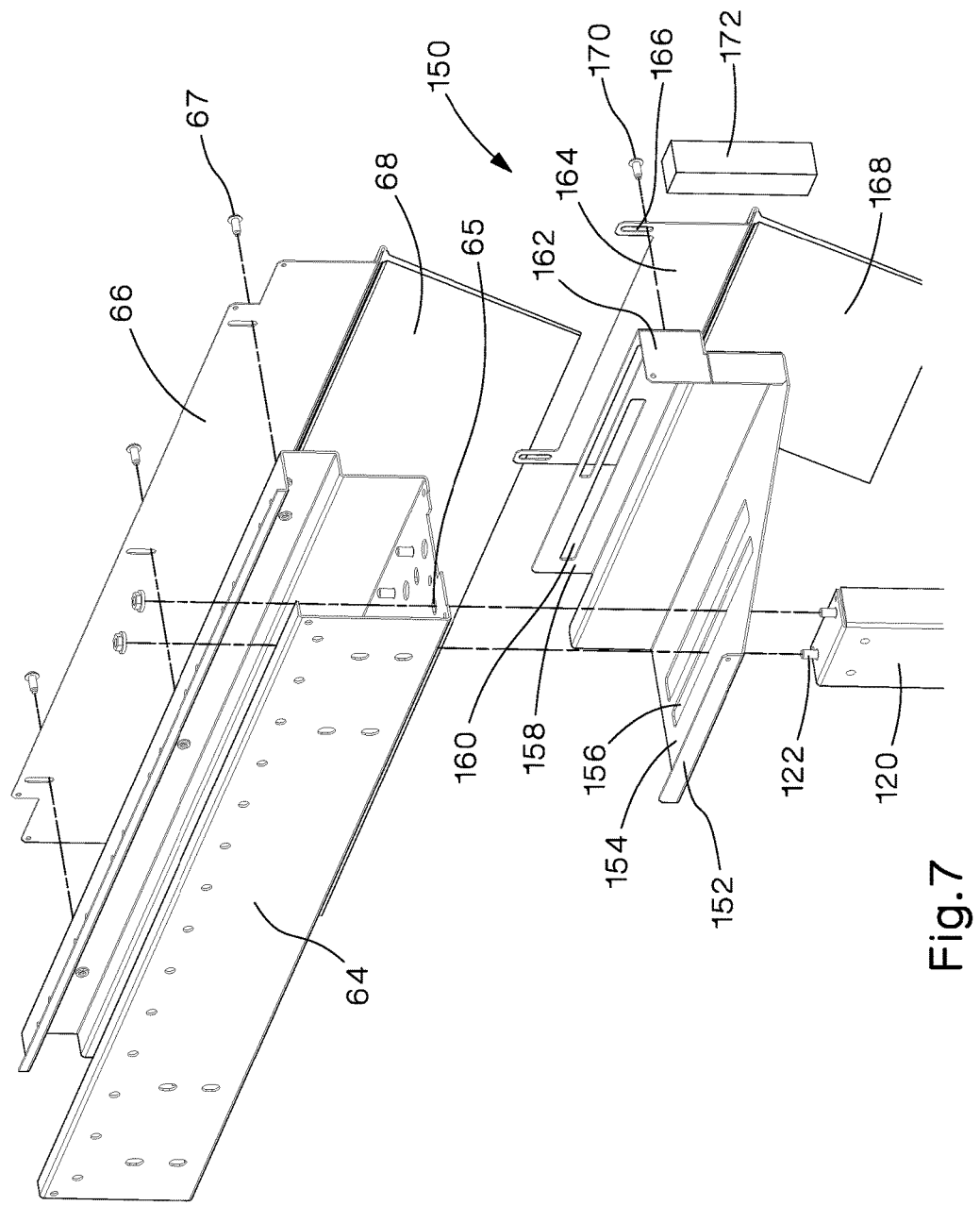
FIG. 7 is an exploded perspective view of the containment column adapter of FIG. 6.

FIG. 7 illustrates an exploded view of the containment column adapter 150. The containment column adapter 150 includes a wall beam extension 152 and a wall beam extension clamp 164. These parts are designed to seal the gap 110 between the building column 100 and the wall beam 64. The wall beam extension 152 is positioned below the wall beam 64. The wall beam extension 152 includes a horizontal member 154 with a plurality of adjustment slots 156 to enable the wall beam extension 152 to be adjusted to the width of the gap 110. The wall beam extension 152 also includes a vertical member 158 with adjustment slots 160. A mid span post 120 is positioned below the wall beam extension 152 and the wall beam 64. As illustrated by dashed lines, post studs 122 extending from the mid span post 120 extend through the slots 156 in the wall beam extension 152 into the holes 65 in the bottom surface of the wall beam 64. An adhesive foam seal 172 is attached to the end face 162 of the wall beam extension 152. The foam seal 172 can be compressed against the building column 100 to provide a seal.

A wall beam extension clamp 164 with a flap seal 168 attached thereto is secured to the wall beam extension 152. The wall beam extension clamp 164 includes adjustment slots 166. The wall beam extension clamp 164 is placed behind the wall beam clamp 66. The wall beam extension clamp 164 is held in place by the wall beam extension clamp attachment screw 170 and the last wall beam clamp attachment screw 67. The flap seal 168 provides a seal against a cabinet or blanking panel, similar to the flap seal 68 that is provided with the wall beam 64.

Alternatively, a ceiling mounted threaded rod (not illustrated) can be used instead of the mid span post to support the wall beam and wall beam extensions. The threaded rods would pass through the holes in the wall beam into the slots in the wall beam extension.

Figure 8:
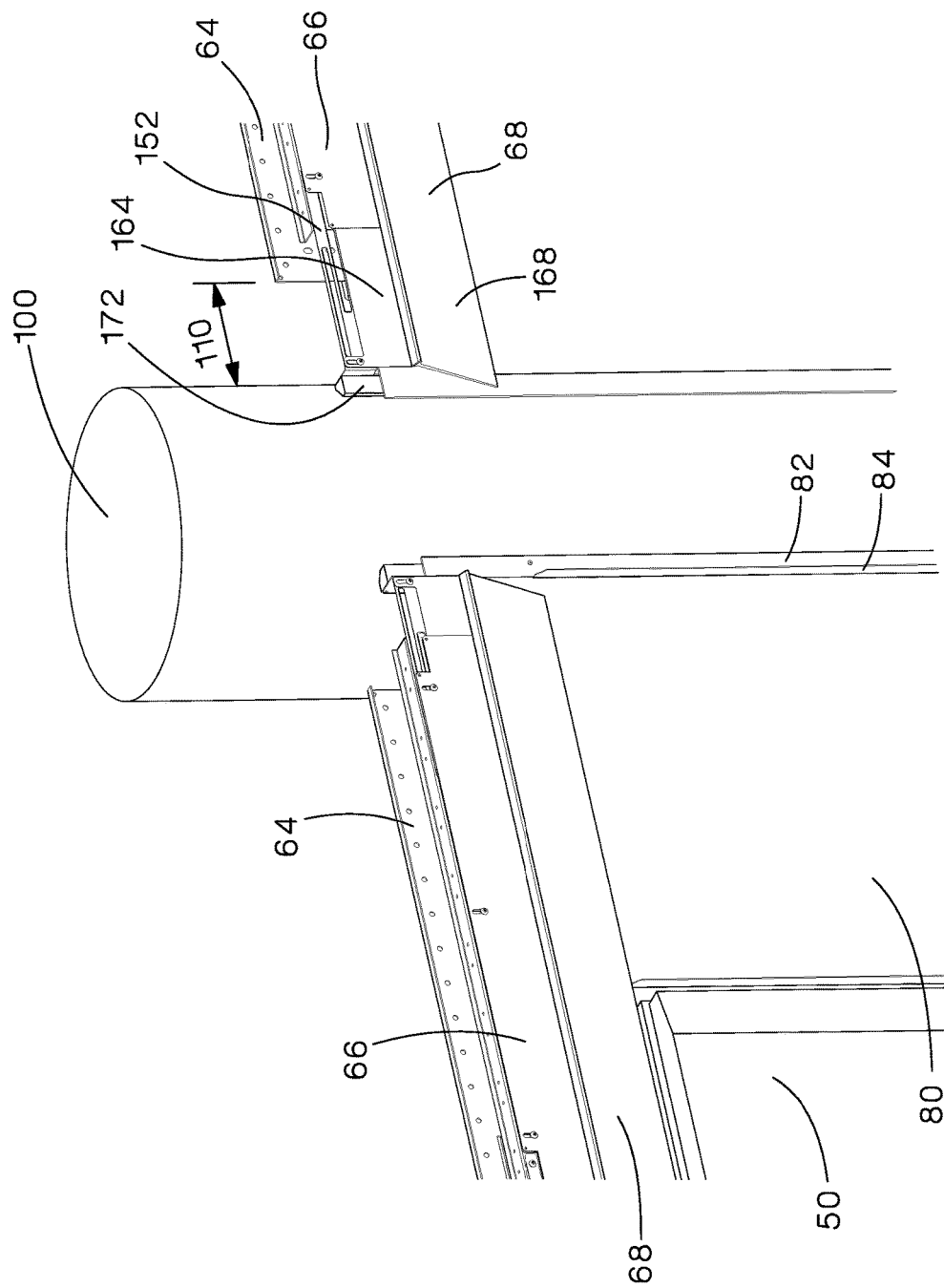
FIG. 8 is a perspective view of the aisle containment system of FIG. 6 with cabinets and blanking panels installed around the cylindrical building column.
Figure 9:
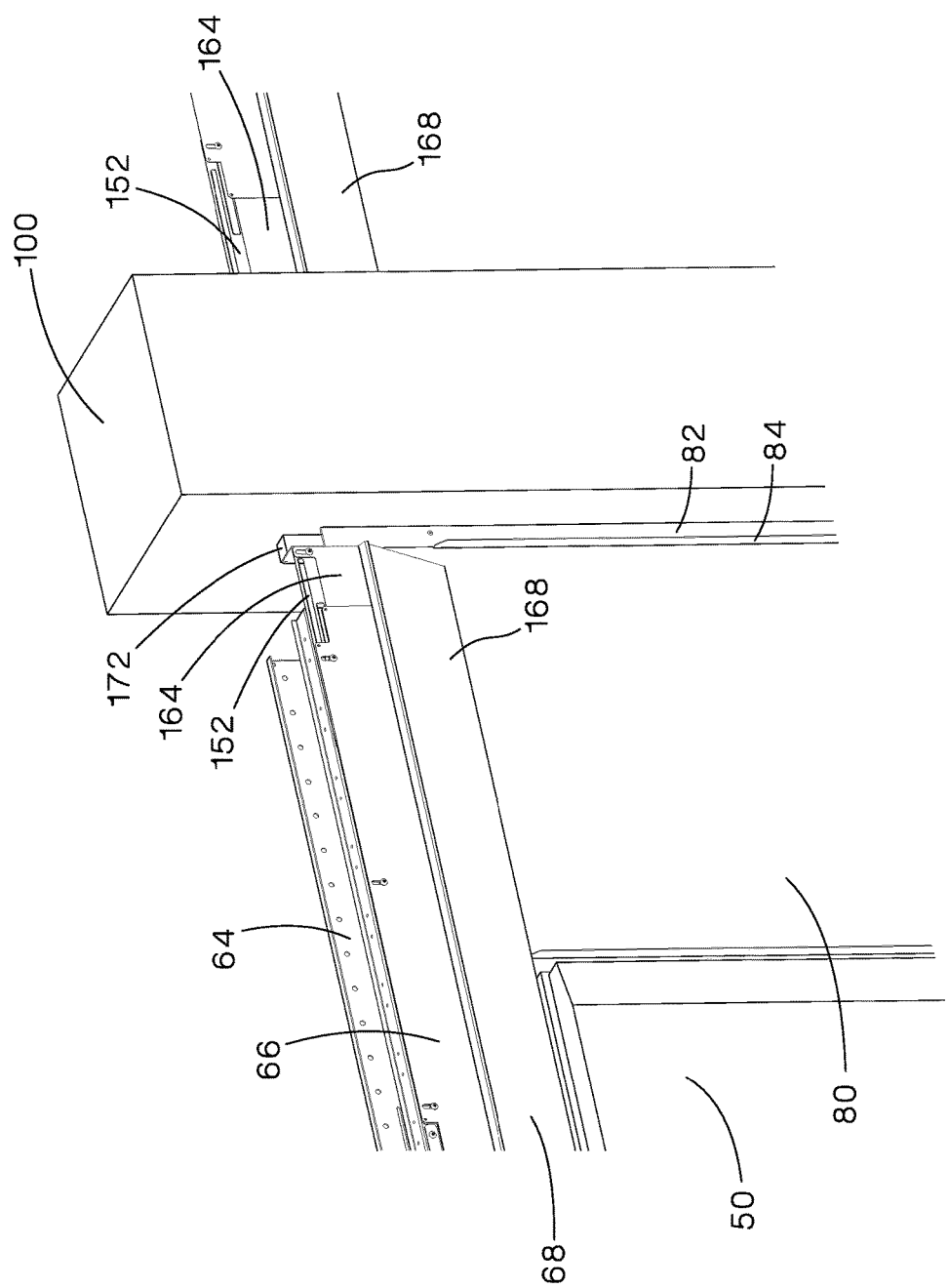
FIG. 9 is a perspective view of the aisle containment system of FIG. 6 with cabinets and blanking panels installed around a rectangular building column.

FIGS. 8 and 9 illustrate a perspective view of a section of the aisle containment system with an installed containment column adapter 150, cabinets 50, and vertical blanking panels 80 with vertical stiffeners 82 to seal the gaps 110 between the building column 100 and the cabinets 50. FIG. 8 illustrates the containment column adapter 150 installed around a cylindrical building column and FIG. 9 illustrates the containment column adapter installed around a rectangular building column. The blanking panels 80 and vertical stiffener 82 are disclosed in Applicant's U.S. Pat. No. 9,255,417. The blanking panel 80 is positioned adjacent the cabinet 50 and in front of the mid span post 120. The blanking panel 80 is also positioned behind the wall beam clamp 66 and the wall beam extension clamp 164. The flap seal 168 presses against the blanking panel 80 to create a seal.

The blanking panel 80 covers the area below the wall beam 64 and between the cabinet 50 and the building column 100. If necessary, the width of the vertical blanking panel 80 is adjusted to fill the gap 110 between the building column 100 and the cabinet 50. The blanking panel 80 butts up against the building column 100. If desired, foam strips can also be used to provide an additional seal between the blanking panel 80 and the building column 100.

As illustrated in FIGS. 3 and 4, the aisle beams 86 and ceiling panels 90 also need to accommodate each building column 100. The ceiling panels 90 need to be cut to fit around the cylindrical or rectangular building column. If an aisle beam 86 is going to interfere with the building column 100, the aisle beam 86 must also be cut around the building column 100. Without a wall beam 64, there is nothing supporting the end of the aisle beam 86. As a result, a flexible roof support 190 and aisle beam supports 200 must be installed to support the aisle beam 86 and ceiling panels 90.

Figure 10:
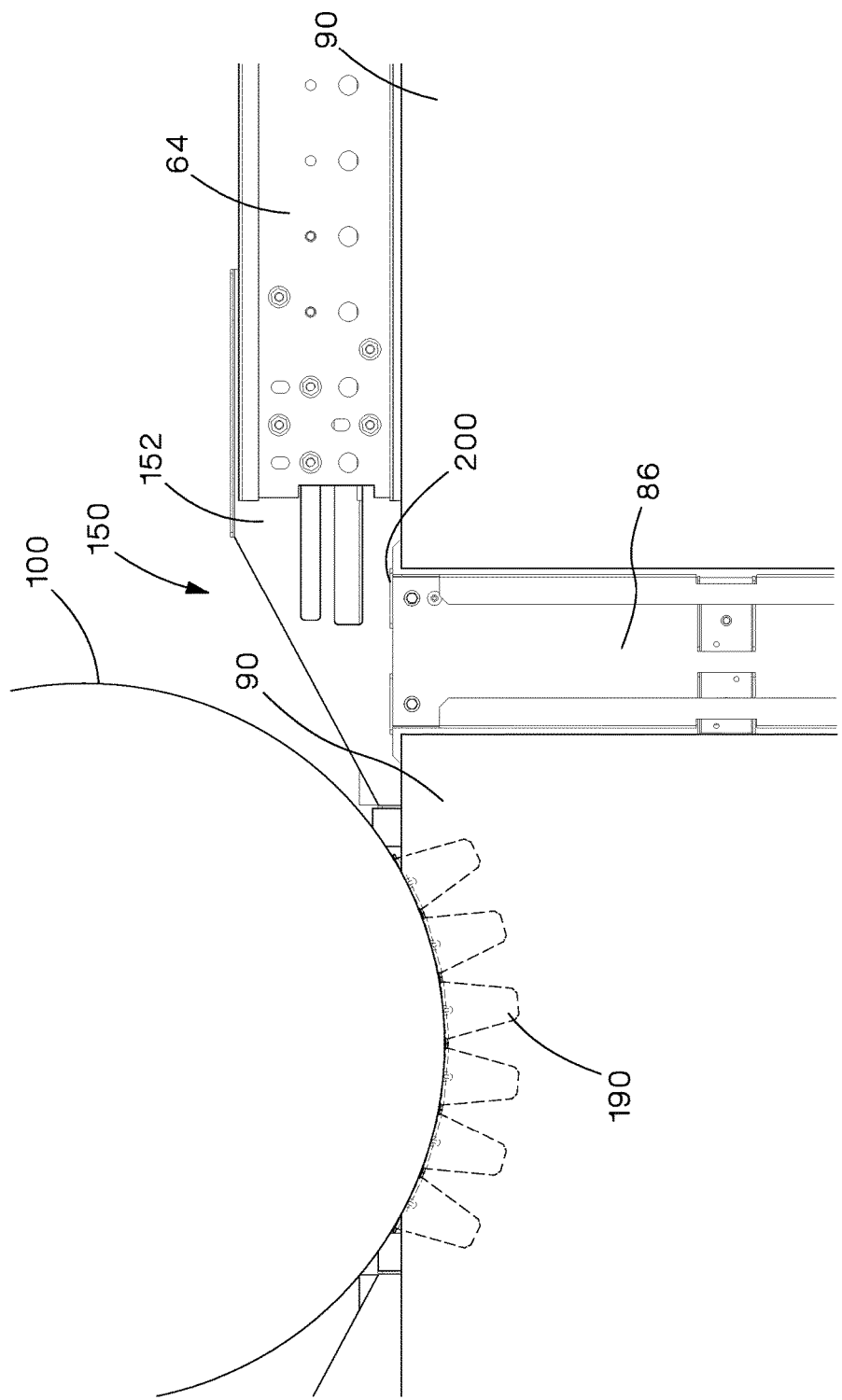
FIG. 10 is a top view of the ceiling panels and aisle beam around the building column of the aisle containment system of FIG. 4.
Figure 11:
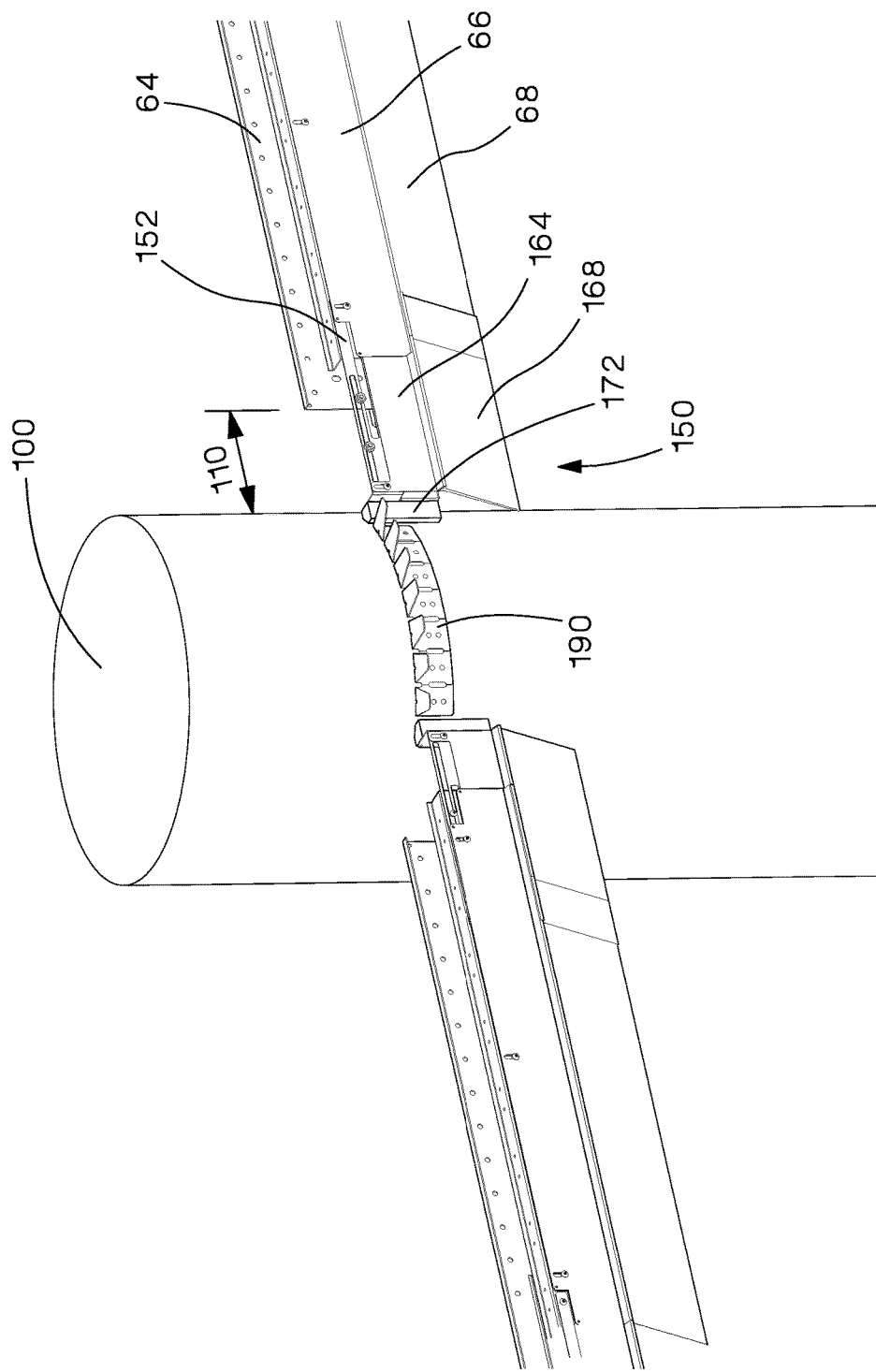
FIG. 11 is a perspective view from inside the aisle of the cylindrical building column with the flexible roof support of FIG. 10.
Figure 12:
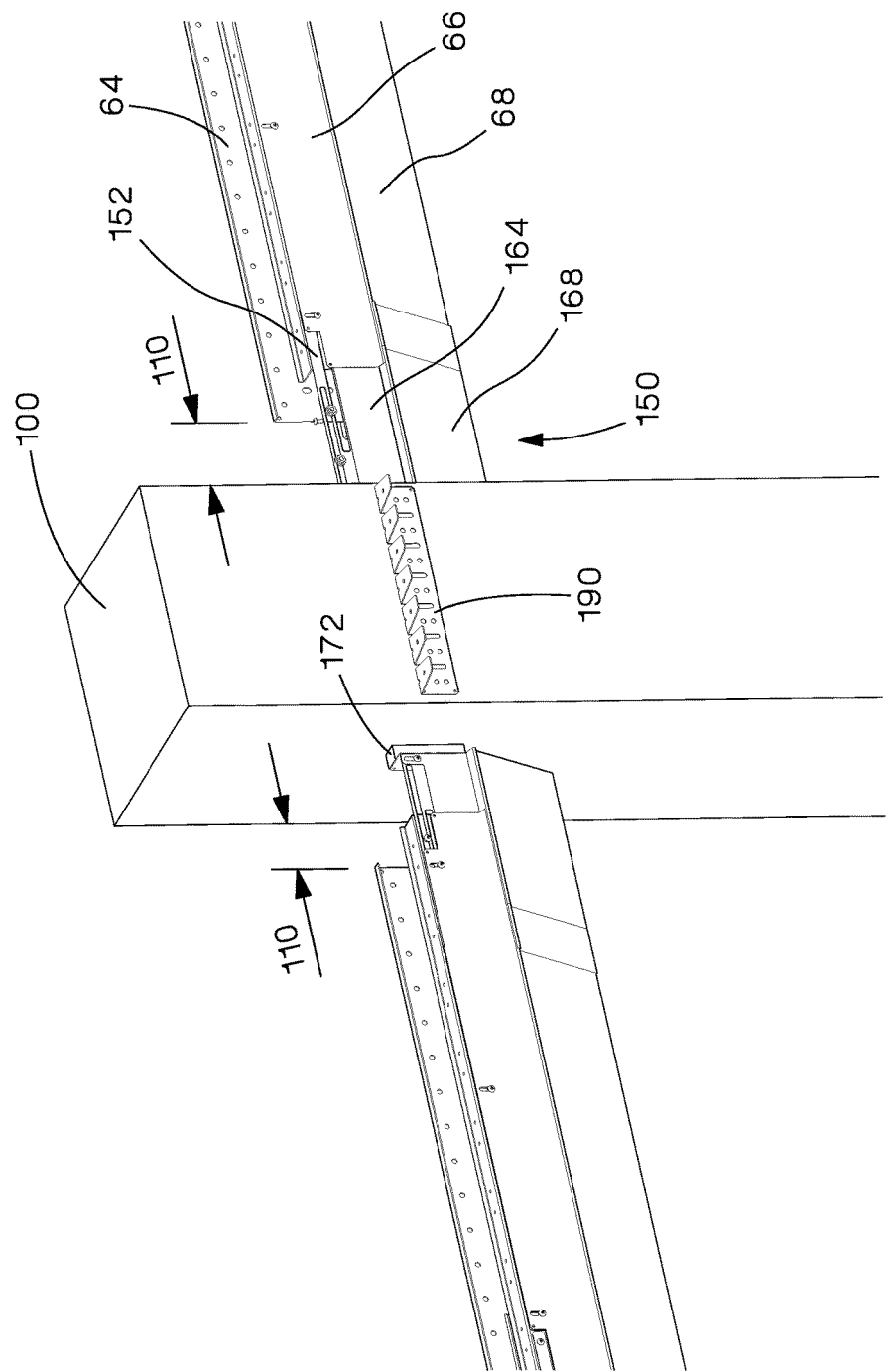
FIG. 12 is a perspective view from inside the aisle of the rectangular building column with the flexible roof support of FIG. 10.

FIGS. 10-15 illustrate the containment column adapter 150, the flexible roof support 190 with the adjusted aisle beams 86 and ceiling panels 90. FIG. 10 illustrates an aisle beam 86 located between the wall beam 64 and the building column 100. A flexible roof support 190 is installed around the building column 100 to support the end of the aisle beam 86 next to the building column 100. As illustrated in FIGS. 11 and 12, the flexible roof support 190 conforms to the structure of the building column 100, cylindrical or rectangular, respectively. The flexible roof support 190 is secured to the building column 100 prior to installing the aisle beams 86 and ceiling panels 90.

Figure 13:
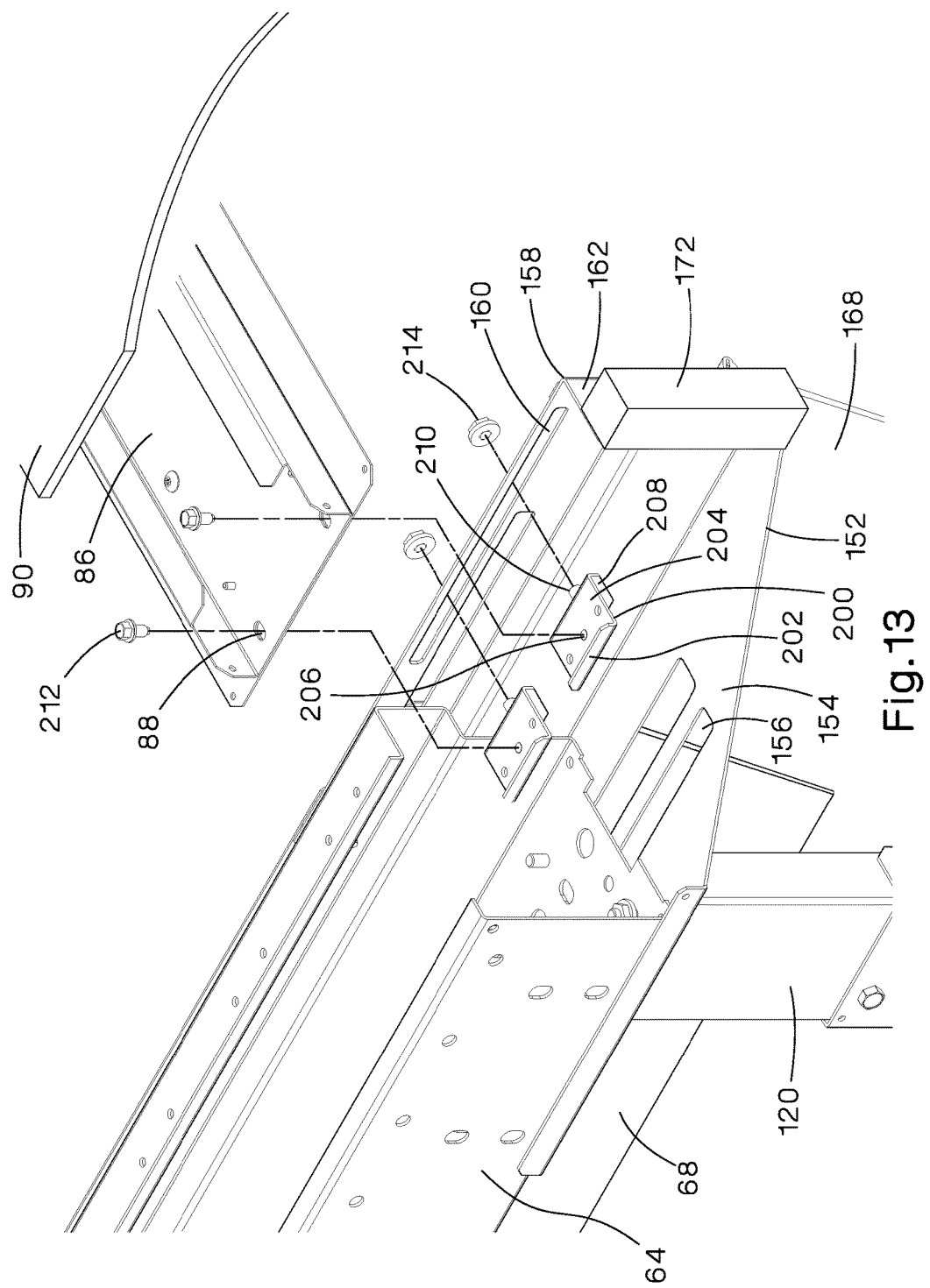
FIG. 13 is a partial exploded top perspective view of the aisle beam and aisle beam supports of FIG. 10.
Figure 14:
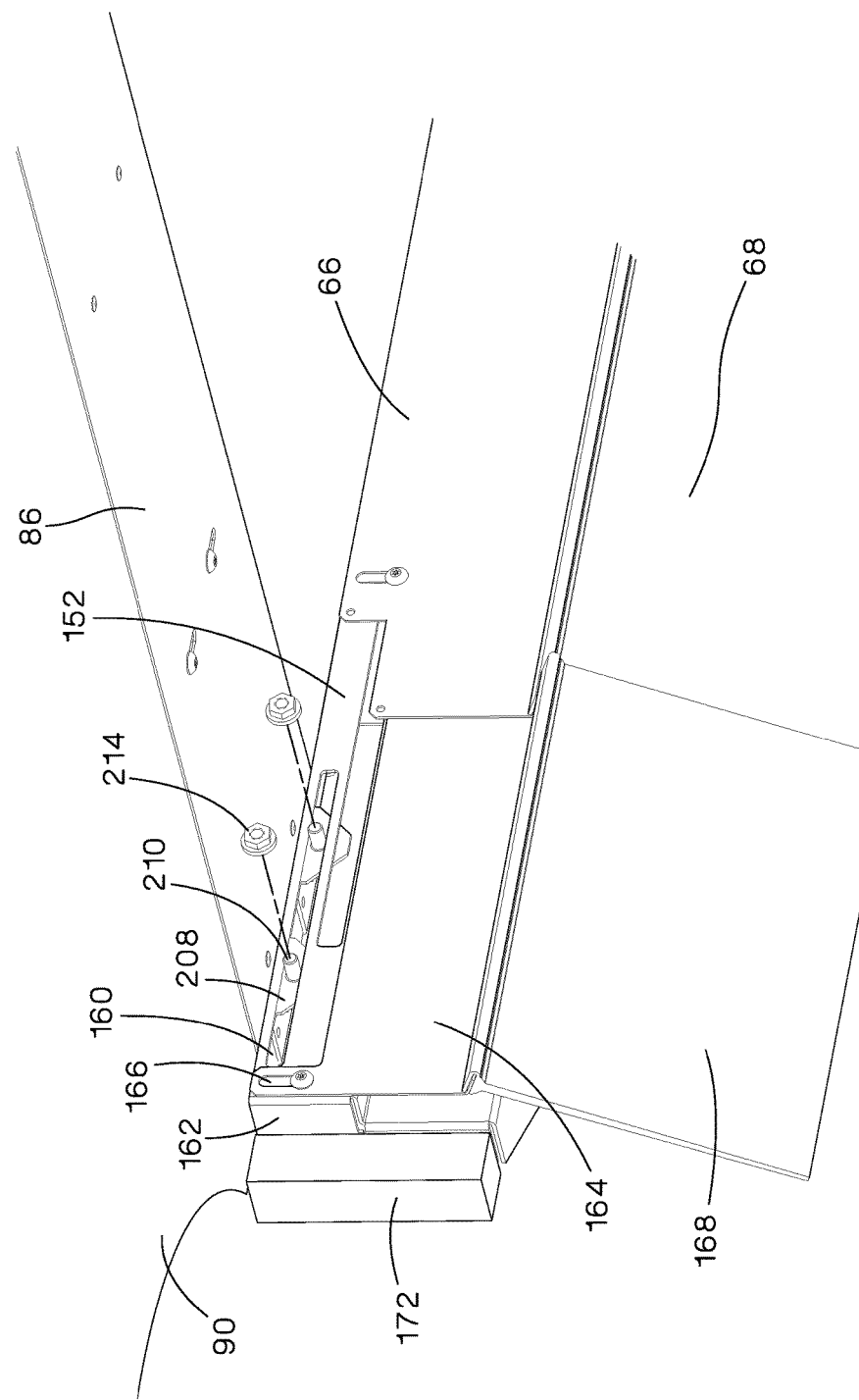
FIG. 14 is a partially assembled view of the wall beam extension and the aisle beam supports of FIG. 13.
Figure 15:
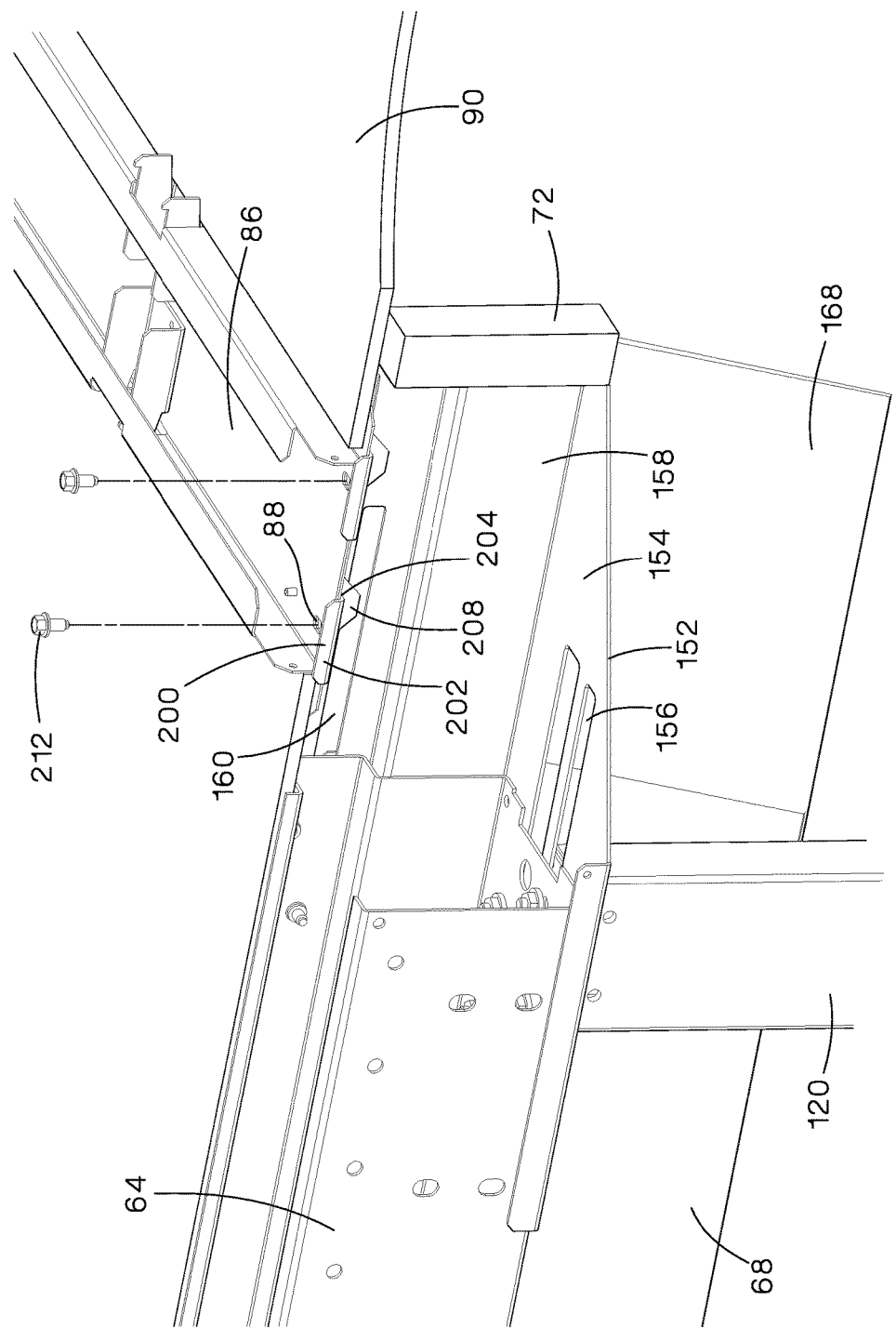
FIG. 15 is a partially assembled top perspective view of the wall beam extension, the aisle beam supports and the aisle beam of FIG. 13.

FIGS. 13-15 provide detailed views of the aisle beam 86 being secured to the wall beam extension 152. The aisle beam 86 is secured to the wall beam extension 152 via aisle beam supports 200 and fastening devices 212, 214.

The aisle beam supports 200 include a first upwardly extending vertical member 202, a main horizontal member 204, and a second downwardly extending vertical member 208. The horizontal main member 204 includes a plurality of holes 206 for receiving fasteners 212. The downwardly extending vertical member 208 includes a post 210. The aisle beam supports 200 are positioned adjacent to the wall beam extension 152 with the posts 210 extending through the top slot 160 in the wall beam extension 152. Nuts 214 engage the posts 210 to secure the aisle beam supports 200 to the wall beam extension 152 (see FIG. 14). Once the aisle beam supports 200 are secured to the wall beam extension 152, the aisle beam 86 is positioned on the aisle beam supports 200 and a fastener 212 is inserted through openings 88, 206 in the aisle beam and the aisle beam supports, respectively, (see FIG. 15). Additionally, if desired, only one aisle beam support 200 can be used when only half of the aisle beam 86 is supported by the wall beam 64.

FIGS. 13-15 also illustrate the ceiling panels 90 cut to fit around the circular building column 100.

Foam strips can be installed, where necessary, to seal any remaining gaps created when cutting ceiling panels and the aisle beams around the building column. Blanking foam strips may also be used to seal across any exposed slots, such as on the vertical face of the wall beam extension.

Furthermore, while the preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:

1. An aisle containment system comprising:
   a frame defined by wall beams, header frames, and a plurality of posts;
   a plurality of cabinets positioned within the frame;
   mid-span posts positioned adjacent building columns located within the frame, the mid-span posts for supporting the wall beams on one side of the frame;
   at least one containment column adapter secured to one of the wall beams and one of the mid-span posts; wherein the at least one containment column adapter seals gaps between the building column and the wall beam within the frame of the aisle containment system.

2. The aisle containment system of claim 1, wherein the at least one containment column adapter includes a wall beam extension and a wall beam extension clamp, wherein the wall beam extension is positioned below one of the wall beams.

3. The aisle containment system of claim 2, wherein the wall beam extension includes a horizontal member with a plurality of slots for enabling the wall beam extension to be adjusted to fill a width of the gap.

4. The aisle containment system of claim 3, wherein post studs extend from the mid-span posts, the post studs extend through the slots in the horizontal member of the wall beam extension and into holes in a bottom surface of one of the wall beams.

5. The aisle containment system of claim 2, wherein the wall beam extension includes a vertical member with a plurality of slots for receiving fasteners to secure the wall beam extension clamp.

6. The aisle containment system of claim 2, wherein the wall beam extension clamp having a flap seal and adjustment slots for receiving fasteners to secure the wall beam extension clamp.

7. The aisle containment system of claim 2, wherein the wall beam extension having an end face; a foam seal is attached to the end face for providing a seal between the wall beam extension and the building column.

8. The aisle containment system of claim 1, further comprising a plurality of blanking panels positioned within the frame for filling openings within the aisle containment system.

9. The aisle containment system of claim 1, further comprising ceiling panels and aisle beams extending across a width of the frame; and
   a flexible roof support secured to the building column, the flexible roof support receives an end of the aisle beams adjacent the building column.

10. The aisle containment system of claim 9, wherein the flexible roof support conforms to the structure of the building column.

11. The aisle containment system of claim 9, further comprising aisle beam supports, the aisle beam supports secure one of the aisle beams to the wall beam extension.

12. The aisle containment system of claim 11, wherein the aisle beam supports include a first upwardly extending vertical member, a main horizontal member, and a second downwardly extending member.

13. The aisle containment system of claim 12, wherein the downwardly extending vertical member includes a post that extends through one of the slots in the wall beam extension; and the horizontal main member includes a plurality of holes for receiving fasteners to secure one of the aisle beams to the aisle beam supports.

* * * * *